(12) United States Patent
Kroeger et al.

(10) Patent No.: US 10,248,496 B2
(45) Date of Patent: Apr. 2, 2019

(54) ITERATIVE FORWARD ERROR CORRECTION DECODING FOR FM IN-BAND ON-CHANNEL RADIO BROADCASTING SYSTEMS

(71) Applicant: iBiquity Digital Corporation, Columbia, MD (US)

(72) Inventors: Brian W. Kroeger, Sykesville, MD (US); Paul J. Peyla, Elkridge, MD (US)

(73) Assignee: Ibiquity Digital Corporation, Columbia, MD (US)

( * ) Notice: Subject to any disclaimer, the term of this patent is extended or adjusted under 35 U.S.C. 154(b) by 0 days.

(21) Appl. No.: 14/266,907

(22) Filed: May 1, 2014

(65) Prior Publication Data

US 2014/0331111 A1 Nov. 6, 2014

Related U.S. Application Data

(60) Provisional application No. 61/818,978, filed on May 3, 2013, provisional application No. 61/827,118, filed on May 24, 2013.

(51) Int. Cl.
*G06F 11/10* (2006.01)
*H03M 13/41* (2006.01)
(Continued)

(52) U.S. Cl.
CPC ....... *G06F 11/1004* (2013.01); *H03M 13/413* (2013.01); *H03M 13/4115* (2013.01);
(Continued)

(58) Field of Classification Search
CPC .. G06F 11/1004; H04L 1/0061; H04L 1/0072; H04L 1/0041; H04L 1/005;
(Continued)

(56) References Cited

U.S. PATENT DOCUMENTS 6,108,386 A * 8/2000 Chen ................. H03M 13/4115
375/265
6,161,210 A 12/2000 Chen et al.
(Continued)

OTHER PUBLICATIONS

Chen, Brian et al., "An Integrated Error Correction and Detection System for Digital Audio Broadcasting", IEEE Transactions on Broadcasting, vol. 46, No. 1, Mar. 2000, pp. 68-78/.
(Continued)

*Primary Examiner* — Thien Nguyen
(74) *Attorney, Agent, or Firm* — Schwegman Lundberg & Woessner, P.A.

(57) ABSTRACT

A method for processing a digital signal includes: receiving a plurality of protocol data units, each having a header including a plurality of control word bits; and a plurality of audio frames, each including a cyclic redundancy check code; decoding the protocol data units using an iterative decoding technique, wherein the iterative decoding technique uses a soft output decoding algorithm for iterations after the first iteration; and using decoded cyclic redundancy check codes to flag the audio frames containing errors. A receiver that implements the method is also provided.

21 Claims, 10 Drawing Sheets

(51) Int. Cl.
*H04L 1/00* (2006.01)
*H04H 60/11* (2008.01)
*H03M 13/09* (2006.01)

(52) U.S. Cl.
CPC ............. *H04H 60/11* (2013.01); *H04L 1/005* (2013.01); *H04L 1/007* (2013.01); *H04L 1/0041* (2013.01); *H04L 1/0061* (2013.01); *H04L 1/0072* (2013.01); *H03M 13/09* (2013.01); *H04H 2201/18* (2013.01)

(58) Field of Classification Search
CPC .... H04L 1/007; H04H 60/11; H04H 2201/18; H03M 13/4115; H03M 13/413; H03M 13/09
See application file for complete search history.

(56) References Cited

U.S. PATENT DOCUMENTS

| | | | |
|---|---|---|---|
| 6,378,101 B1 | 4/2002 | Sinha et al. | |
| 6,587,826 B1 | 7/2003 | Laneman et al. | |
| 6,799,294 B1 | 9/2004 | Chung et al. | |
| 7,305,043 B2 | 12/2007 | Milbar et al. | |
| 7,512,175 B2 | 3/2009 | Kroeger | |
| 8,111,716 B2 | 2/2012 | Iannuzzelli et al. | |
| 2002/0108086 A1* | 8/2002 | Irvin | H04L 1/004 714/758 |
| 2009/0103659 A1* | 4/2009 | Chen | H03M 13/413 375/341 |
| 2011/0044398 A1* | 2/2011 | Dowling | H04L 1/0051 375/286 |
| 2011/0197112 A1* | 8/2011 | Parthasarathy | H03M 13/4146 714/791 |
| 2012/0198308 A1* | 8/2012 | Varnica | H03M 13/29 714/760 |
| 2012/0246548 A1* | 9/2012 | Buckley | H03M 13/09 714/807 |
| 2014/0153625 A1* | 6/2014 | Vojcic | H04L 1/005 375/224 |

OTHER PUBLICATIONS

Seshadri, Nambirajan, "List Viterbi Decoding Algorithms with Applications", IEEE Transactions on Communications, vol. 42, No. 2/3/4, Feb./Mar./Apr. 1994.

Hagenauer, Joachim, "Iterative Decoding of Binary Block and Convolutional Codes", IEEE Trasnactions on Information Theory, vol. 42, No. 2, Mar. 1996.

National Radio Systems Committee, NRSC-5-B, "In-Band/on-channel Digital Radio Broadcasting Standard", National Association of Broadcasters, Apr. 2008.

* cited by examiner

ITERATIVE FORWARD ERROR CORRECTION DECODING FOR FM IN-BAND ON-CHANNEL RADIO BROADCASTING SYSTEMS

CROSS-REFERENCE TO RELATED APPLICATIONS

This application claims the benefit of U.S. Provisional Patent Application Ser. No. 61/818,978, filed May 3, 2013, titled "Iterative Forward Error Correction Decoding For FM In-Band On-Channel Radio Broadcasting Systems", and U.S. Provisional Patent Application Ser. No. 61/827,118, filed May 24, 2013, titled "Iterative Forward Error Correction Decoding For FM In-Band On-Channel Radio Broadcasting Systems". Both of these applications are hereby incorporated by reference.

FIELD OF THE INVENTION

This invention relates to methods for signal processing in In-Band On-Channel radio broadcasting systems, and to receivers that implement such signal processing.

BACKGROUND OF THE INVENTION

Digital radio broadcasting technology delivers digital audio and data services to mobile, portable, and fixed receivers. One type of digital radio broadcasting, referred to as in-band on-channel (IBOC) broadcasting, uses terrestrial transmitters in the existing Medium Frequency (MF) and Very High Frequency (VHF) radio bands. HD Radio™ technology, developed by iBiquity Digital Corporation, is one example of an IBOC implementation for digital radio broadcasting and reception. IBOC signals can be transmitted in a hybrid format including an analog modulated carrier in combination with a plurality of digitally modulated carriers or in an all-digital format wherein the analog modulated carrier is not used. Using the hybrid mode, broadcasters may continue to transmit analog AM and FM simultaneously with higher-quality and more robust digital signals, allowing themselves and their listeners to convert from analog-to-digital radio while maintaining their current frequency allocations.

U.S. Pat. No. 8,111,716 B2, titled "Method And Apparatus For Formatting Data Signals In A Digital Audio Broadcasting System", describes an in-band on-channel broadcasting system and is hereby incorporated by reference.

The National Radio Systems Committee, a standard-setting organization sponsored by the National Association of Broadcasters and the Consumer Electronics Association, adopted an IBOC standard, designated NRSC-5A, in September 2005. NRSC-5A, the disclosure of which is incorporated herein by reference, sets forth the requirements for broadcasting digital audio and ancillary data over AM and FM broadcast channels. The standard and its reference documents contain detailed explanations of the RF/transmission subsystem and the transport and service multiplex subsystems. Copies of the standard can be obtained from the NRSC. iBiquity's HD Radio™ technology is an implementation of the NRSC-5A IBOC standard.

SUMMARY OF THE INVENTION

In one embodiment, the invention provides a method for processing a digital signal. The method includes: receiving a plurality of protocol data units, each having a header including a plurality of control word bits; and a plurality of data packets, each including a cyclic redundancy check code; decoding the protocol data units using an iterative decoding technique, wherein the iterative decoding technique uses a soft output decoding algorithm for iterations after the first iteration; and using decoded cyclic redundancy check codes to flag the data packets containing errors.

In another embodiment, the invention provides a radio receiver including: circuitry configured to receive a plurality of protocol data units, each having a header including a plurality of control word bits; and a plurality of data packets, each including a cyclic redundancy check code; to decode the protocol data units using an iterative decoding technique, wherein the iterative decoding technique uses a soft output decoding algorithm for iterations after the first iteration; and to use decoded cyclic redundancy check codes to flag the data packets containing errors.

DETAILED DESCRIPTION

IBOC System and Waveforms

FIGS. 1-7 are included in the incorporated U.S. Pat. No. 8,111,716 B2, and, along with the following description, provide a general description of an IBOC system, including broadcasting equipment structure and operation, receiver structure and operation, and the structure of several IBOC waveforms.

Figure 1:
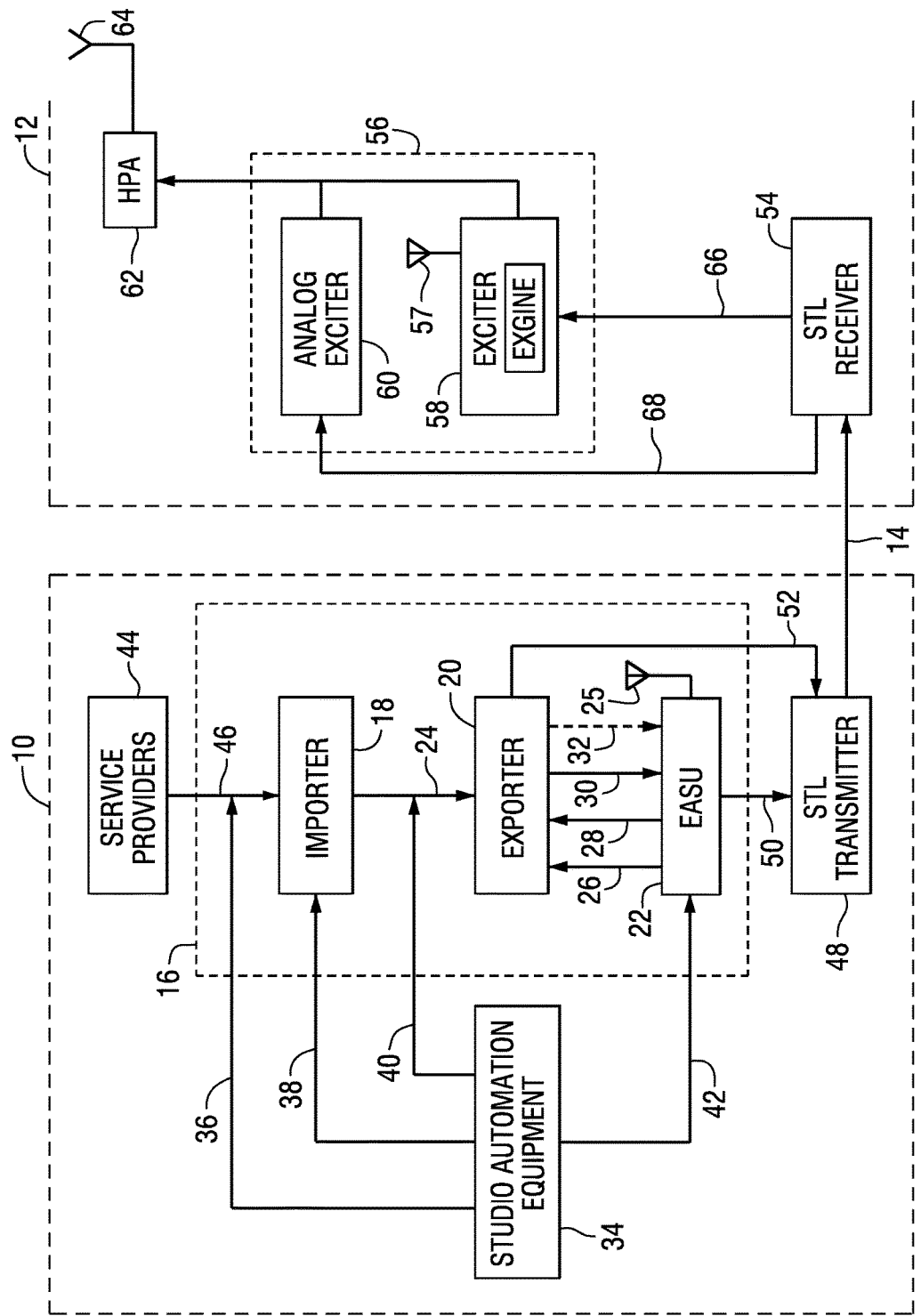
FIG. 1 is a block diagram of a transmission system for use in an in-band on-channel digital radio broadcasting system.

Referring to the drawings, FIG. 1 is a functional block diagram of the relevant components of a studio site 10, an FM transmitter site 12, and a studio transmitter link (STL) 14 that can be used to broadcast an FM IBOC signal. The studio site includes, among other things, studio automation equipment 34, an Ensemble Operations Center (EOC) 16 that includes an importer 18, an exporter 20, an exciter auxiliary service unit (EASU) 22, and an STL transmitter 48. The transmitter site 12 includes an STL receiver 54, a digital exciter 56 that includes an exciter engine (exgine) subsystem 58, and an analog exciter 60. While in FIG. 1 the exporter is resident at a radio station's studio site and the exciter is located at the transmission site, these elements may be co-located at the transmission site.

At the studio site, the studio automation equipment supplies main program service (MPS) audio 42 to the EASU, MPS data 40 to the exporter, supplemental program service (SPS) audio 38 to the importer, and SPS data 36 to the importer. MPS audio serves as the main audio programming source. In hybrid modes, it preserves the existing analog radio programming formats in both the analog and digital transmissions. MPS data, also known as program service data (PSD), includes information such as music title, artist, album name, etc. Supplemental program service can include supplementary audio content as well as program associated data.

The importer contains hardware and software for supplying advanced application services (AAS). A "service" is content that is delivered to users via an IBOC DAB broadcast, and AAS can include any type of data that is not classified as MPS, SPS, or Station Information Service (SIS). SIS provides station information, such as call sign, absolute time, position correlated to GPS, etc. Examples of AAS data include real-time traffic and weather information, navigation map updates or other images, electronic program guides, multimedia programming, other audio services, and other content. The content for AAS can be supplied by service providers 44, which provide service data 46 to the importer via an application program interface (API). The service providers may be a broadcaster located at the studio site or externally sourced third-party providers of services and content. The importer can establish session connections between multiple service providers. The importer encodes and multiplexes service data 46, SPS audio 38, and SPS data 36 to produce exporter link data 24, which is output to the exporter via a data link.

The exporter 20 contains the hardware and software necessary to supply the main program service and SIS for broadcasting. The exporter accepts digital MPS audio 26 over an audio interface and compresses the audio. The exporter also multiplexes MPS data 40, exporter link data 24, and the compressed digital MPS audio to produce exciter link data 52. In addition, the exporter accepts analog MPS audio 28 over its audio interface and applies a pre-programmed delay to it to produce a delayed analog MPS audio signal 30. This analog audio can be broadcast as a backup channel for hybrid IBOC DAB broadcasts. The delay compensates for the system delay of the digital MPS audio, allowing receivers to blend between the digital and analog program without a shift in time. In an AM transmission system, the delayed MPS audio signal 30 is converted by the exporter to a mono signal and sent directly to the STL as part of the exciter link data 52.

The EASU 22 accepts MPS audio 42 from the studio automation equipment, rate converts it to the proper system clock, and outputs two copies of the signal, one digital (26) and one analog (28). The EASU includes a GPS receiver that is connected to an antenna 25. The GPS receiver allows the EASU to derive a master clock signal, which is synchronized to the exciter's clock by use of GPS units. The EASU provides the master system clock used by the exporter. The EASU is also used to bypass (or redirect) the analog MPS audio from being passed through the exporter in the event the exporter has a catastrophic fault and is no longer operational. The bypassed audio 32 can be fed directly into the STL transmitter, eliminating a dead-air event.

STL transmitter 48 receives delayed analog MPS audio 50 and exciter link data 52. It outputs exciter link data and delayed analog MPS audio over STL link 14, which may be either unidirectional or bidirectional. The STL link may be a digital microwave or Ethernet link, for example, and may use the standard User Datagram Protocol or the standard TCP/IP.

The transmitter site includes an STL receiver 54, an exciter 56 and an analog exciter 60. The STL receiver 54 receives exciter link data, including audio and data signals as well as command and control messages, over the STL link 14. The exciter link data is passed to the exciter 56, which produces the IBOC DAB waveform. The exciter includes a host processor, digital up-converter, RF up-converter, and exgine subsystem 58. The exgine accepts exciter link data and modulates the digital portion of the IBOC DAB waveform. The digital up-converter of exciter 56 converts from digital-to-analog the baseband portion of the exgine output. The digital-to-analog conversion is based on a GPS clock, common to that of the exporter's GPS-based clock derived from the EASU. Thus, the exciter 56 includes a GPS unit and antenna 57. An alternative method for synchronizing the exporter and exciter clocks can be found in U.S. Pat. No. 7,512,175 B2, the disclosure of which is hereby incorporated by reference. The RF up-converter of the exciter up-converts the analog signal to the proper in-band channel frequency. The up-converted signal is then passed to the high power amplifier 62 and antenna 64 for broadcast. In an AM transmission system, the exgine subsystem coherently adds the backup analog MPS audio to the digital waveform in the hybrid mode; thus, the AM transmission system does not include the analog exciter 60. In addition, the exciter 56 produces phase and magnitude information and the analog signal is output directly to the high power amplifier.

IBOC DAB signals can be transmitted in both AM and FM radio bands, using a variety of waveforms. The waveforms include an FM hybrid IBOC DAB waveform, an FM all-digital IBOC DAB waveform, an AM hybrid IBOC DAB waveform, and an AM all-digital IBOC DAB waveform.

Figure 2:
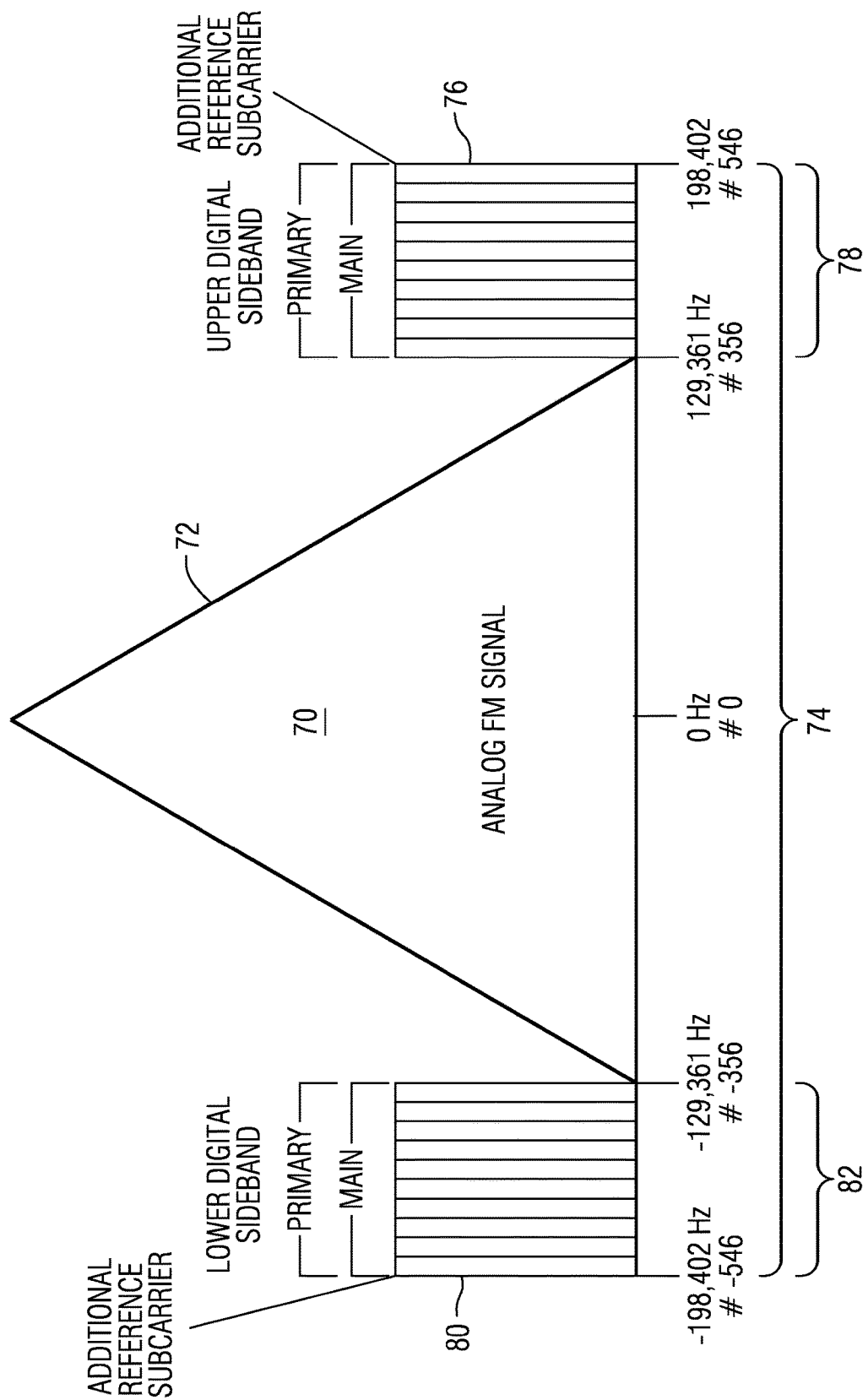
FIG. 2 is a schematic representation of a hybrid FM IBOC waveform.

FIG. 2 is a schematic representation of a hybrid FM IBOC waveform 70. The waveform includes an analog modulated signal 72 located in the center of a broadcast channel 74, a first plurality of evenly spaced orthogonally frequency division multiplexed subcarriers 76 in an upper sideband 78, and a second plurality of evenly spaced orthogonally frequency division multiplexed subcarriers 80 in a lower sideband 82. The digitally modulated subcarriers are divided into partitions and various subcarriers are designated as reference subcarriers. A frequency partition is a group of 19 OFDM subcarriers containing 18 data subcarriers and one reference subcarrier.

The hybrid waveform includes an analog FM-modulated signal, plus digitally modulated primary main subcarriers. The subcarriers are located at evenly spaced frequency locations. The subcarrier locations are numbered from −546 to +546. In the waveform of FIG. 2, the subcarriers are at locations +356 to +546 and −356 to −546. Each primary main sideband is comprised of ten frequency partitions. Subcarriers 546 and −546, also included in the primary main sidebands, are additional reference subcarriers. The amplitude of each subcarrier can be scaled by an amplitude scale factor.

Figure 3:
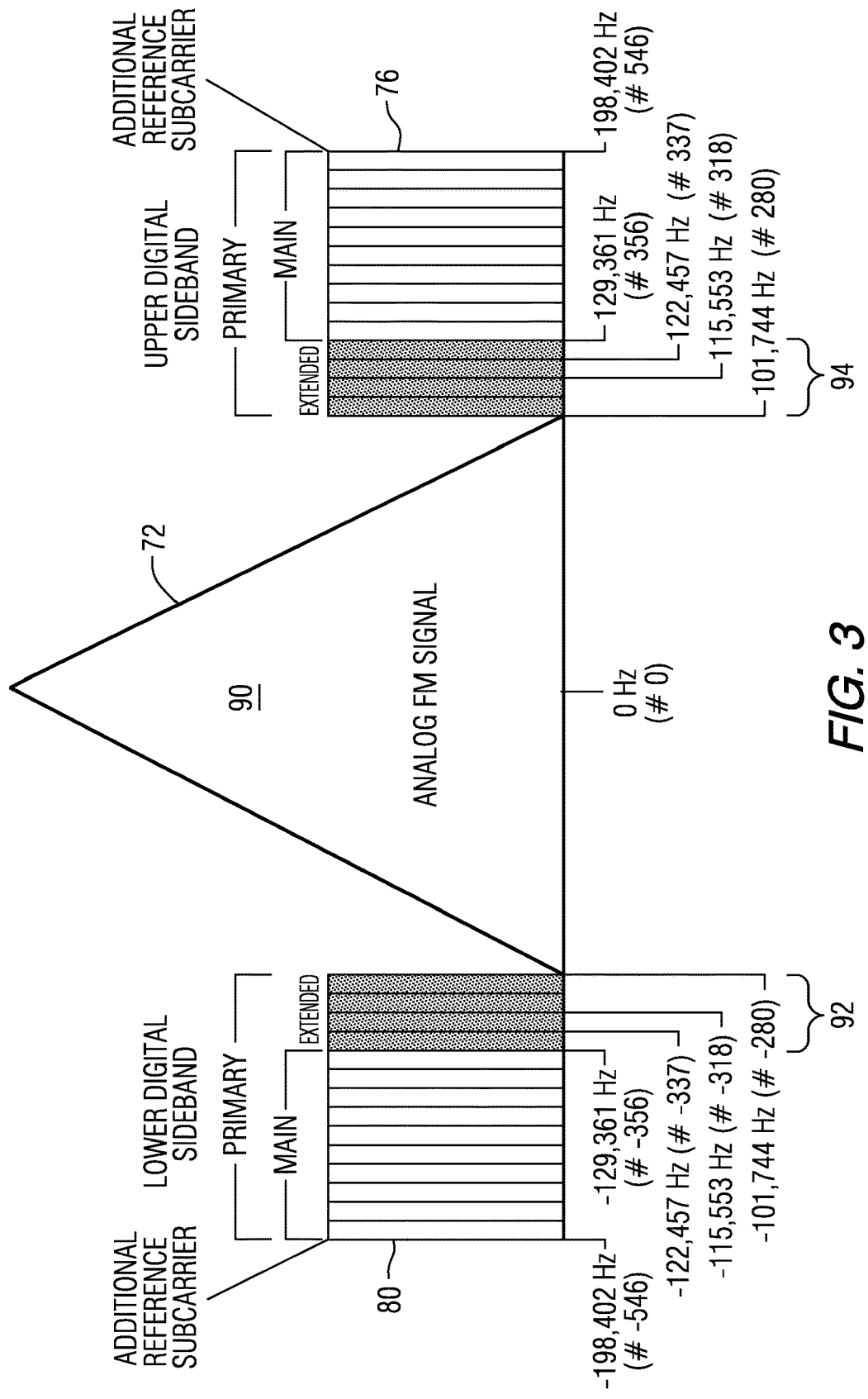
FIG. 3 is a schematic representation of an extended hybrid FM IBOC waveform.

FIG. 3 is a schematic representation of an extended hybrid FM IBOC waveform 90. The extended hybrid waveform is created by adding primary extended sidebands 92, 94 to the primary main sidebands present in the hybrid waveform. One, two, or four frequency partitions can be added to the inner edge of each primary main sideband. The extended hybrid waveform includes the analog FM signal plus digitally modulated primary main subcarriers (subcarriers +356 to +546 and −356 to −546) and some or all primary extended subcarriers (subcarriers +280 to +355 and −280 to −355).

The upper primary extended sidebands include subcarriers 337 through 355 (one frequency partition), 318 through 355 (two frequency partitions), or 280 through 355 (four frequency partitions). The lower primary extended sidebands include subcarriers −337 through −355 (one frequency partition), −318 through −355 (two frequency partitions), or −280 through −355 (four frequency partitions). The amplitude of each subcarrier can be scaled by an amplitude scale factor.

Figure 4:
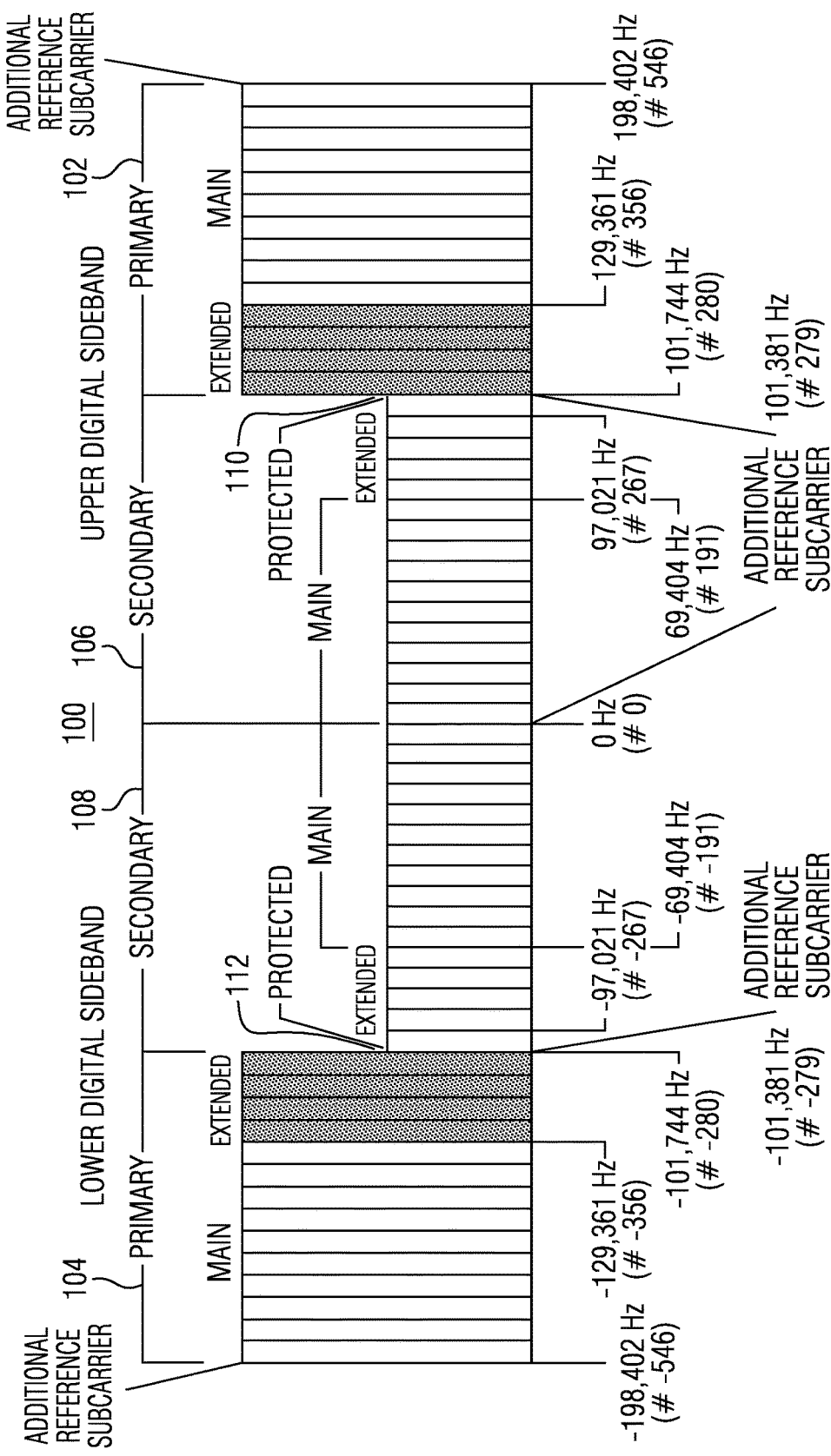
FIG. 4 is a schematic representation of an all-digital FM IBOC waveform.

FIG. 4 is a schematic representation of an all-digital FM IBOC waveform 100. The all-digital waveform is constructed by disabling the analog signal, fully expanding the bandwidth of the primary digital sidebands 102, 104, and adding lower-power secondary sidebands 106, 108 in the spectrum vacated by the analog signal. The all-digital waveform in the illustrated embodiment includes digitally modulated subcarriers at subcarrier locations −546 to +546, without an analog FM signal.

In addition to the ten main frequency partitions, all four extended frequency partitions are present in each primary sideband of the all-digital waveform. Each secondary sideband also has ten secondary main (SM) and four secondary extended (SX) frequency partitions. Unlike the primary sidebands, however, the secondary main frequency partitions are mapped nearer to the channel center with the extended frequency partitions farther from the center.

Each secondary sideband also supports a small secondary protected (SP) region 110, 112 including 12 OFDM subcarriers and reference subcarriers 279 and −279. The sidebands are referred to as "protected" because they are located in the area of spectrum least likely to be affected by analog or digital interference. An additional reference subcarrier is placed at the center of the channel (0). Frequency partition ordering of the SP region does not apply since the SP region does not contain frequency partitions.

Each secondary main sideband spans subcarriers 1 through 190 or −1 through −190. The upper secondary extended sideband includes subcarriers 191 through 266, and the upper secondary protected sideband includes subcarriers 267 through 278, plus additional reference subcarrier 279. The lower secondary extended sideband includes subcarriers −191 through −266, and the lower secondary protected sideband includes subcarriers −267 through −278, plus additional reference subcarrier −279. The total frequency span of the entire all-digital spectrum is 396,803 Hz. The amplitude of each subcarrier can be scaled by an amplitude scale factor. The secondary sideband amplitude scale factors can be user selectable. Any one of the four may be selected for application to the secondary sidebands.

In each of the waveforms, the digital signal is modulated using orthogonal frequency division multiplexing (OFDM). OFDM is a parallel modulation scheme in which the data stream modulates a large number of orthogonal subcarriers, which are transmitted simultaneously. OFDM is inherently flexible, readily allowing the mapping of logical channels to different groups of subcarriers.

In the hybrid waveform, the digital signal is transmitted in primary main (PM) sidebands on either side of the analog FM signal in the hybrid waveform. The power level of each sideband is appreciably below the total power in the analog FM signal. The analog signal may be monophonic or stereo, and may include subsidiary communications authorization (SCA) channels.

In the extended hybrid waveform, the bandwidth of the hybrid sidebands can be extended toward the analog FM signal to increase digital capacity. This additional spectrum, allocated to the inner edge of each primary main sideband, is termed the primary extended (PX) sideband.

In the all-digital waveform, the analog signal is removed and the bandwidth of the primary digital sidebands is fully extended as in the extended hybrid waveform. In addition, this waveform allows lower-power digital secondary sidebands to be transmitted in the spectrum vacated by the analog FM signal.

Figure 5:
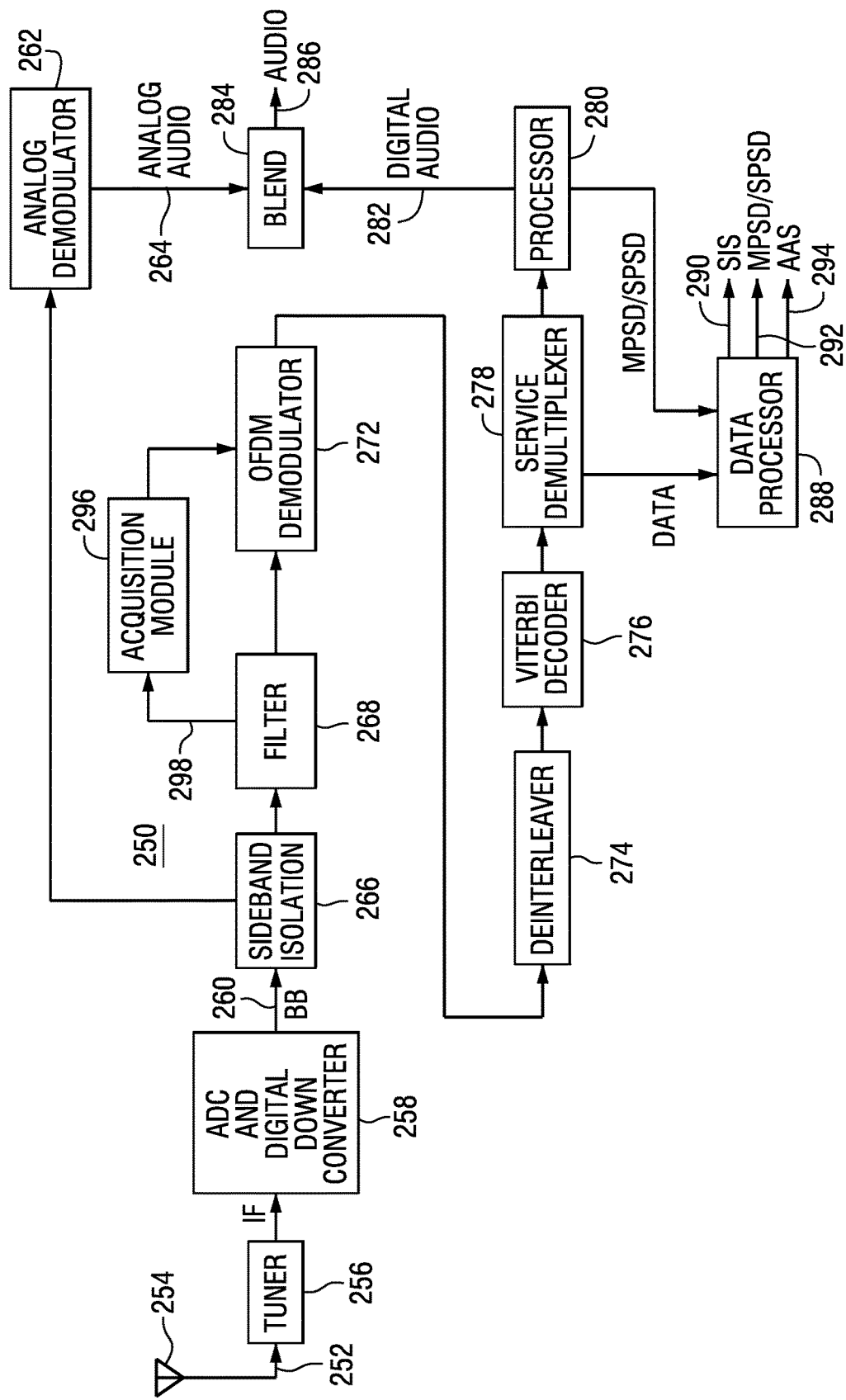
FIG. 5 is a functional block diagram of an FM IBOC DAB receiver.

FIG. 5 is a simplified functional block diagram of an FM IBOC DAB receiver 250. The receiver includes an input 252 connected to an antenna 254 and a tuner or front end 256. A received signal is provided to an analog-to-digital converter and digital down converter 258 to produce a baseband signal at output 260 comprising a series of complex signal samples. The signal samples are complex in that each sample comprises a "real" component and an "imaginary" component, which is sampled in quadrature to the real component. An analog demodulator 262 demodulates the analog modulated portion of the baseband signal to produce an analog audio signal on line 264. The digitally modulated portion of the sampled baseband signal is next filtered by sideband isolation filter 266, which has a pass-band frequency response comprising the collective set of subcarriers $f_1$-$f_n$ present in the received OFDM signal. Filter 268 suppresses the effects of a first-adjacent interferer. Complex signal 298 is routed to the input of acquisition module 296, which acquires or recovers OFDM symbol timing offset or error and carrier frequency offset or error from the received OFDM symbols as represented in received complex signal 298. Acquisition module 296 develops a symbol timing offset $\Delta t$ and carrier frequency offset $\Delta f$, as well as status and control information. The signal is then demodulated (block 272) to demodulate the digitally modulated portion of the baseband signal. Then the digital signal is deinterleaved by a deinterleaver 274, and decoded by a Viterbi decoder 276. A service demultiplexer 278 separates main and supplemental program signals from data signals. A processor 280 processes the main and supplemental program signals to produce a digital audio signal on line 282. The analog and main digital audio signals are blended as shown in block 284, or the supplemental program signal is passed through, to produce an audio output on line 286. A data processor 288 processes the data signals and produces data output signals on lines 290, 292 and 294. The data signals can include, for example, a station information service (SIS), main program service data (MPSD), supplemental program service data (SPSD), and one or more advanced application services (AAS).

In practice, many of the signal processing functions shown in the receiver of FIG. 5 can be implemented using one or more integrated circuits or other circuitry know to those skilled in the art.

Figure 6A:
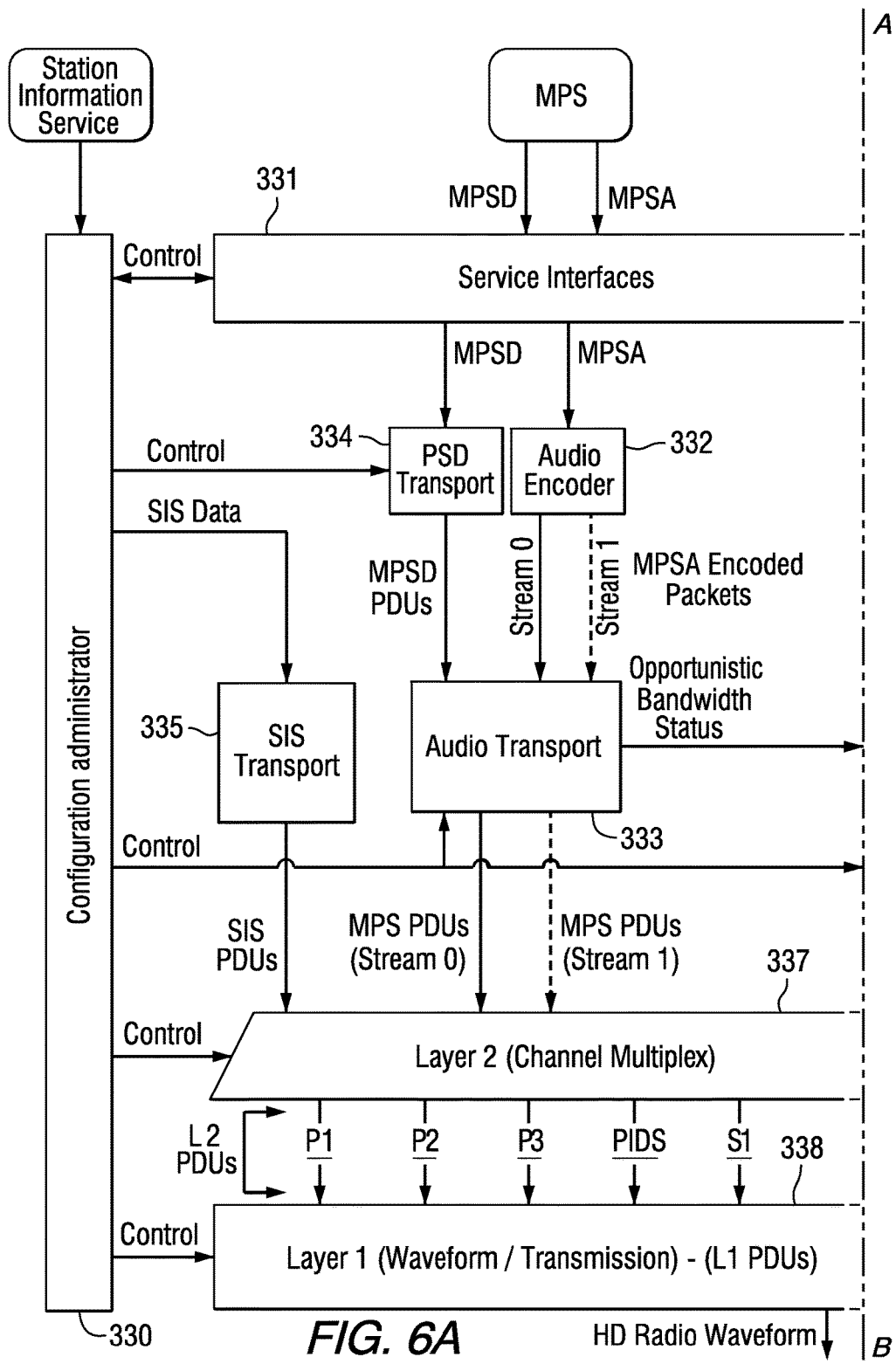
FIGS. 6a and 6b are diagrams of an IBOC DAB logical protocol stack from the broadcast perspective.
Figure 6B:
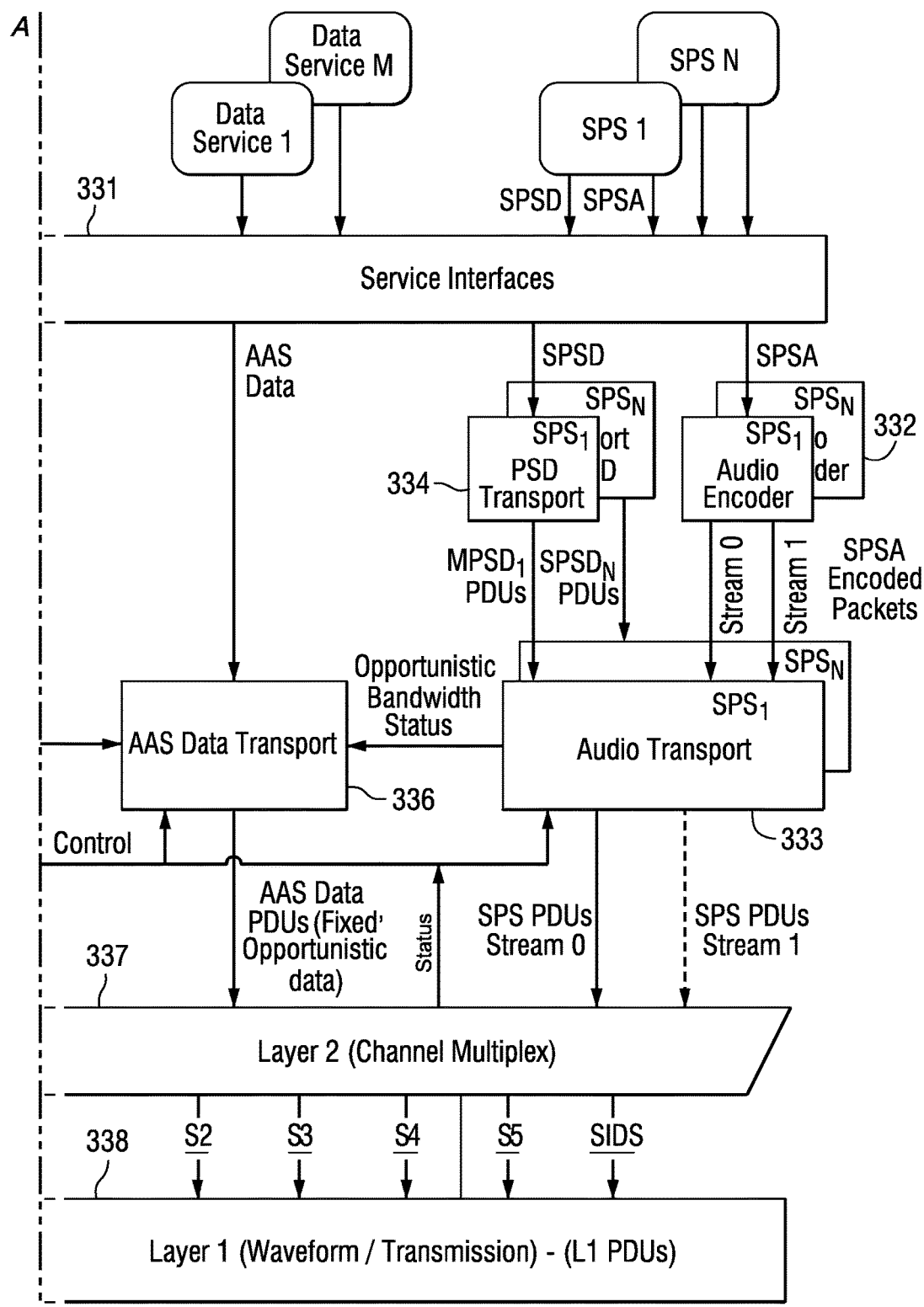

FIGS. 6a and 6b are diagrams of an IBOC DAB logical protocol stack from the transmitter perspective. From the receiver perspective, the logical stack will be traversed in the opposite direction. Most of the data being passed between the various entities within the protocol stack are in the form of protocol data units (PDUs). A PDU is a structured data block that is produced by a specific layer (or process within a layer) of the protocol stack. The PDUs of a given layer may encapsulate PDUs from the next higher layer of the stack and/or include content data and protocol control information originating in the layer (or process) itself. The PDUs generated by each layer (or process) in the transmitter protocol stack are inputs to a corresponding layer (or process) in the receiver protocol stack.

As shown in FIGS. 6a and 6b, there is a configuration administrator 330, which is a system function that supplies configuration and control information to the various entities within the protocol stack. The configuration/control information can include user defined settings, as well as information generated from within the system such as GPS time and position. The service interfaces 331 represent the interfaces for all services except SIS. The service interface may be different for each of the various types of services. For example, for MPS audio and SPS audio, the service interface may be an audio card. For MPS data and SPS data the interfaces may be in the form of different application program interfaces (APIs). For all other data services the interface is in the form of a single API. An audio codec 332 encodes both MPS audio and SPS audio to produce core (Stream 0) and optional enhancement (Stream 1) streams of MPS and SPS audio encoded packets, which are passed to audio transport 333. Audio codec 332 also relays unused capacity status to other parts of the system, thus allowing the inclusion of opportunistic data. MPS and SPS data is processed by program service data (PSD) transport 334 to produce MPS and SPS data PDUs, which are passed to audio transport 333. Audio transport 333 receives encoded audio packets and PSD PDUs and outputs bit streams containing both compressed audio and program service data. The SIS transport 335 receives SIS data from the configuration administrator and generates SIS PDUs. A SIS PDU can contain station identification and location information, program type, as well as absolute time and position correlated to GPS. The AAS data transport 336 receives AAS data from the service interface, as well as opportunistic bandwidth data from the audio transport, and generates AAS data PDUs, which can be based on quality of service parameters. The transport and encoding functions are collectively referred to as Layer 4 of the protocol stack, and the corresponding transport PDUs are referred to as Layer 4 PDUs or L4 PDUs. Layer 2, which is the channel multiplex layer (337), receives transport PDUs from the SIS transport, AAS data transport, and audio transport, and formats them into Layer 2 PDUs. A Layer 2 PDU includes protocol control information and a payload, which can be audio, data, or a combination of audio and data. Layer 2 PDUs are routed through the correct logical channels to Layer 1 (338), wherein a logical channel is a signal path that conducts L1 PDUs through Layer 1 with a specified grade of service. There are multiple Layer 1 logical channels based on service mode, wherein a service mode is a specific configuration of operating parameters specifying throughput, performance level, and selected logical channels. The number of active Layer 1 logical channels and the characteristics defining them vary for each service mode. Status information is also passed between Layer 2 and Layer 1. Layer 1 converts the PDUs from Layer 2 and system control information into an AM or FM IBOC DAB waveform for transmission. Layer 1 processing can include scrambling, channel encoding, interleaving, OFDM subcarrier mapping, and OFDM signal generation. The output of OFDM signal generation is a complex, baseband, time domain pulse representing the digital portion of an IBOC signal for a particular symbol. Discrete symbols are concatenated to form a continuous time domain waveform, which is modulated to create an IBOC waveform for transmission.

Figure 7:
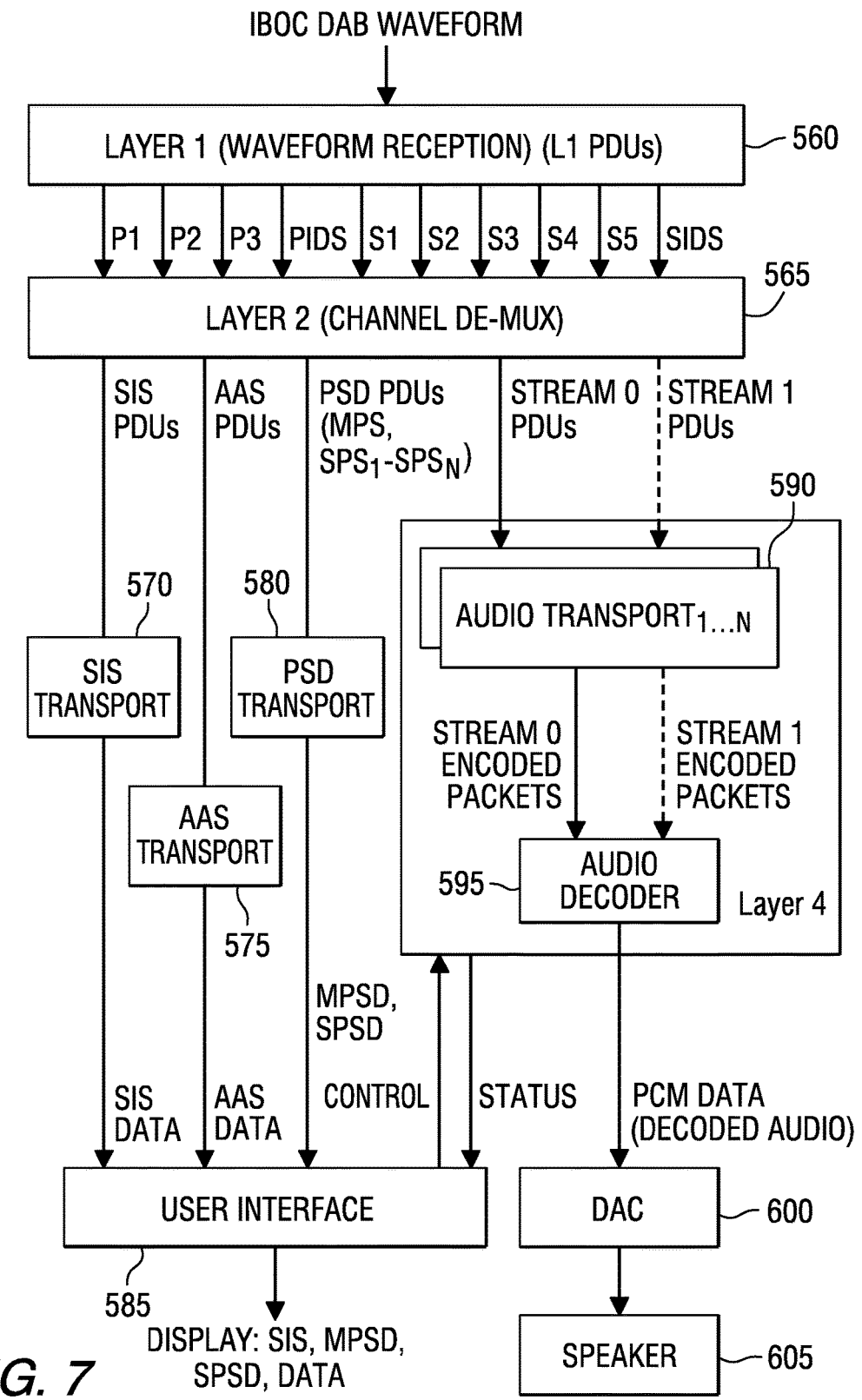
FIG. 7 is a diagram of an IBOC DAB logical protocol stack from the receiver perspective.

FIG. 7 shows the logical protocol stack from the receiver perspective. An IBOC waveform is received by the physical layer, Layer 1 (560), which demodulates the signal and processes it to separate the signal into logical channels. The number and kind of logical channels will depend on the service mode, and may include logical channels P1-P3, PIDS, S1-S5, and SIDS. Layer 1 produces L1 PDUs corresponding to the logical channels and sends the PDUs to Layer 2 (565), which demultiplexes the L1 PDUs to produce SIS PDUs, AAS PDUs, PSD PDUs for the main program service and any supplemental program services, and Stream 0 (core) audio PDUs and Stream 1 (optional enhanced) audio PDUs. The SIS PDUs are then processed by the SIS transport 570 to produce SIS data, the AAS PDUs are processed by the AAS transport 575 to produce AAS data, and the PSD PDUs are processed by the PSD transport 580 to produce MPS data (MPSD) and any SPS data (SPSD). The SIS data, AAS data, MPSD and SPSD are then sent to a user interface 590. The SIS data, if requested by a user, can then be displayed. Likewise, MPSD, SPSD, and any text based or graphical AAS data can be displayed. The Stream 0 and Stream 1 PDUs are processed by Layer 4, comprised of audio transport 590 and audio decoder 595. There may be up to N audio transports corresponding to the number of programs received on the IBOC waveform. Each audio transport produces encoded MPS packets or SPS packets, corresponding to each of the received programs. Layer 4 receives control information from the user interface, including commands such as to store or play programs, and to seek or scan for radio stations broadcasting an all-digital or hybrid IBOC signal. Layer 4 also provides status information to the user interface.

Figure 8:
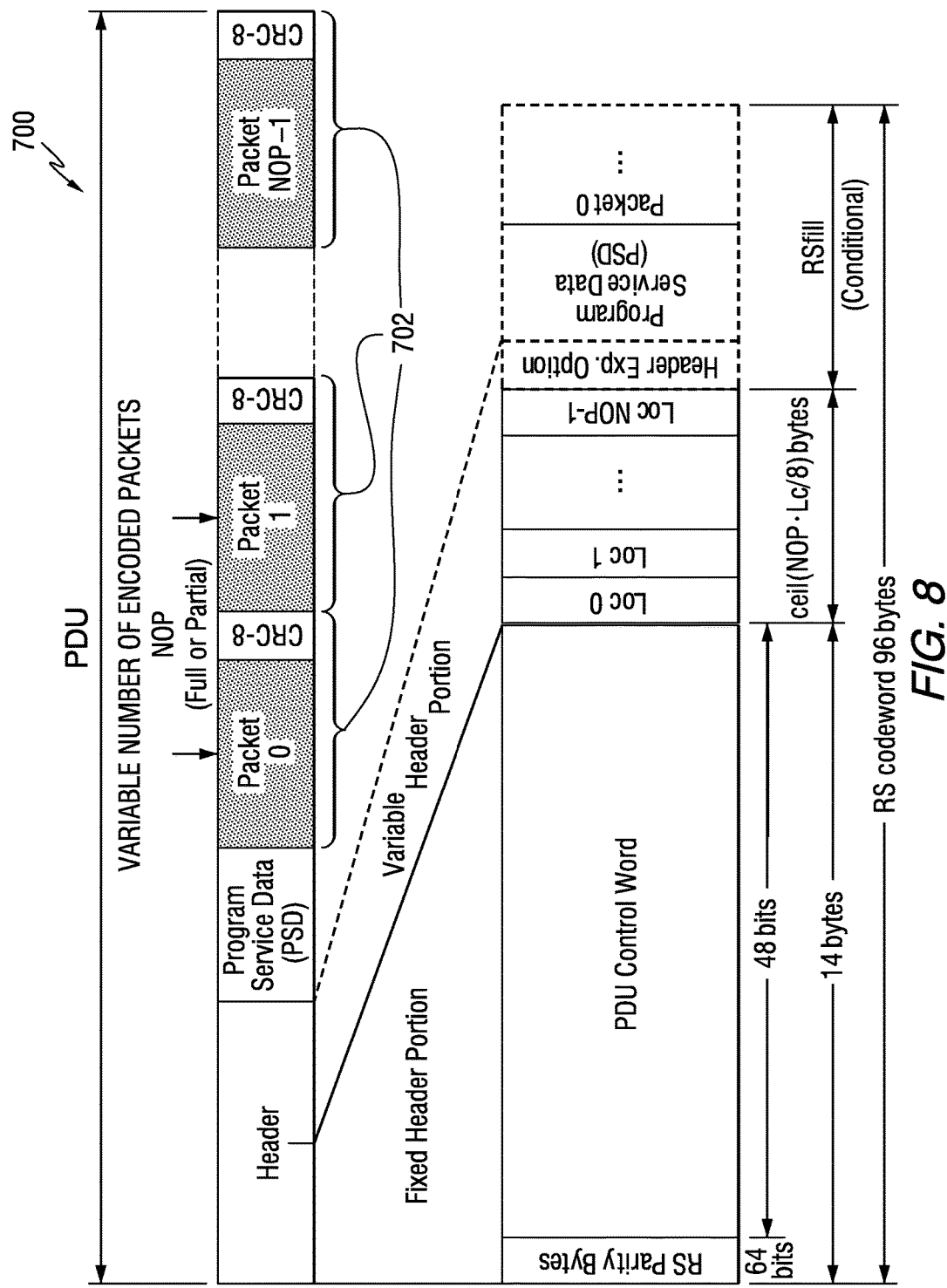
FIG. 8 is a schematic representation of a protocol data unit (PDU) in accordance with an embodiment of the invention.

In broadcasting systems such as those described in U.S. Pat. No. 8,111,716 B2, information is processed in protocol data units (PDUs). FIG. 8 is a schematic representation of an example protocol data unit. Protocol data units can be used in multiple channels in an IBOC system. In one example, one of those channels is designated as a P1 channel.

In various embodiments, this invention utilizes iterative decoding to process digital information received in protocol data units. Iterative decoding techniques improve decoding performance by refining the bit decoding soft information passed between the inner and outer codes over multiple iterations of the decoding process.

P1 PDU Description

In one embodiment illustrated in FIG. 8, a P1 Audio PDU 700 includes a fixed header portion and a variable header portion, followed by 32 variable-length audio frames (AFs) on average. The AFs are shown as packets 702 in FIG. 8. Each audio frame includes a packet field and a cyclic redundancy check field. The variable header portion also includes location pointers to the nth audio frame (i.e., Loc n). NOP is the number of packets (audio frames). Lc is the number of bytes in each of the Loc fields. Then (NOP*Lc/8) is the size of this region of the header. In this embodiment, the header includes 88 information bytes and 8 Reed-Solomon (RS) parity bytes or RS(96, 88, GF(256)). As shown in FIG. 8, a RS fill portion which encompasses the remaining RS bytes is also included. While the example of FIG. 8 illustrates a plurality of audio frames in a PDU, the invention can be used to process other types of data packets that can be included in a PDU.

Variable length AFs can each average about 275 bytes or 2200 bits (e.g., at 48 kbps audio stream rate) including an 8-bit cyclic redundancy check (CRC) as the last byte in each AF. Signal processing in an IBOC radio system can be performed in a plurality of layers (e.g., designated as L1, L2, etc.), where layer L1 is a physical layer. In one embodiment, 2 PDUs at 48 kbps can be accommodated each L1 modem frame. A tailbiting convolutional decoder can be used to decode each PDU without flush bits.

To address Layer 2 Protocol Control Information (PCI), 24-bit Spread Control Word (CW) issues, CW bits are spaced as a function of PDU size, and convolutionally (de)coded. The CW identifies the type of PDU, and is inserted as bits spaced uniformly over the PDU before convolutional coding. The exact CW bit insertion locations are determined by the PDU size. CW bits can be removed as needed for proper header AF location processing. The CW bit are ignored after removal and don't affect the audio frame locations. PCI spacing is determined by a mode transmitted on reference subcarriers in the IBOC waveform.

Packet Header Protection

In a plurality of audio codec modes, the header is protected by an RS(96,88,GF(256)) code. The RS codeword is shortened to a length of 96 bytes. Each codeword includes the header payload bytes along with eight redundancy (parity) bytes. The header payload is illustrated in FIG. 8.

The primitive polynomial used in the RS generation is:

$$p(x)=x^8+x^4+x^3+x^2+1$$

or (100011101 in binary notation, where the least significant bit (LSB) is on the right).

The generator polynomial for the RS code is:

$$g(x)=a^{36}+a^{203}x+a^3x^2+a^{220}x^3+a^{253}x^4+a^{211}x^5+a^{240}x^6+a^{176}x^7+x^8$$

Bytes 0 through 159 of the un-shortened input codeword are set to zero. Byte 160 is the rightmost byte. Byte 247 of the RS codeword is the first byte (leftmost) of the Main Program Service (MPS) PDU control word. The parity bytes are then computed, where the last parity byte of the RS codeword is the first byte (leftmost in FIG. 1) in the audio PDU.

Packet Integrity Control (CRC)

Each encoded audio packet is accompanied by a CRC-8 code for the purpose of receiver integrity check. The CRC generator polynomial used is:

$$g_8(x)=x^8+x^5+x^4+1$$

This polynomial can be represented in binary form as 100110001 where the LSB is on the right. The CRC value can be computed by performing modulo-two division of the encoded audio packet by the generator polynomial $g_8(x)$. The 8-bit remainder inserted into the CRC field will have the least significant bit directly following the last bit of the encoded audio packet.

A second CRC could also be computed for each audio frame to improve the error detection probability. This second CRC byte would use a different polynomial generator since using the same CRC-8 would yield the same missed detection probability. The second CRC would be placed in a portion of a Modem Frame where previously existing receivers are unaware, and new receivers could use these additional CRCs.

PDU List Viterbi Algorithm (LVA) Tailbiting and Header

The PDU of FIG. 8 can be decoded with the first Viterbi decoder output sequence. An M-algorithm could be considered, but tailbiting needs starting probabilities for all start/end states. In another embodiment, the value of M could be expanded around the tail overlap portion of the PDU. This would prevent the algorithm from finding a non-global best sequence where the tailbiting occurs. Another approach is to use Viterbi decoding on a first pass and then reduce M on successive passes.

The tailbiting overlap should span at least the path memory (e.g. 96 bits) past the Header. The tail overlap should be positioned to include the header since it is more reliable with Reed Soloman (RS) protection.

Then the header can be decoded using a Reed Solomon (RS) decoder. If RS is correct, or corrected, then proceed to decode audio frames (AFs). RS protection will ensure that start and end states are either correct with near-certain probability, or a PDU error is detected & flagged.

Optional soft (e.g. Maximum A Posteriori (MAP)) and/or List decoding could be performed on the header. However the nonheader portion of the PDU is likely corrupted if the header fails the initial RS decoding. Although soft decision (e.g. successive erasure techniques) could be used for improved RS decoding performance, this improvement may not be useful if much of the AF information is corrupted. Specifically, if the AF packets are corrupted, they are still not useful even though their locations in the PDU are decoded flawlessly. So it is worth assessing the probabilities of increased useful AFs with improved Header decoding.

Audio Frame List Decoding

The decoded header defines the AF locations in the PDU. It also establishes the start state of the first partial AF, and the end state of the last partial AF. The first and last partial AFs require special processing with adjacent PDUs.

The PCI CW bits must be removed from the PDU after convolution decoding but before CRC processing of each audio frame. This is because the CRC's are computed without the PCW CW bits present. The PDU is convolutionally encoded with the PCI CW bits present. Furthermore, the PCI CW bits must be removed in iterative decoding steps before CRC processing and restored prior to subsequent convolutional decoding in each iteration.

Figure 9:
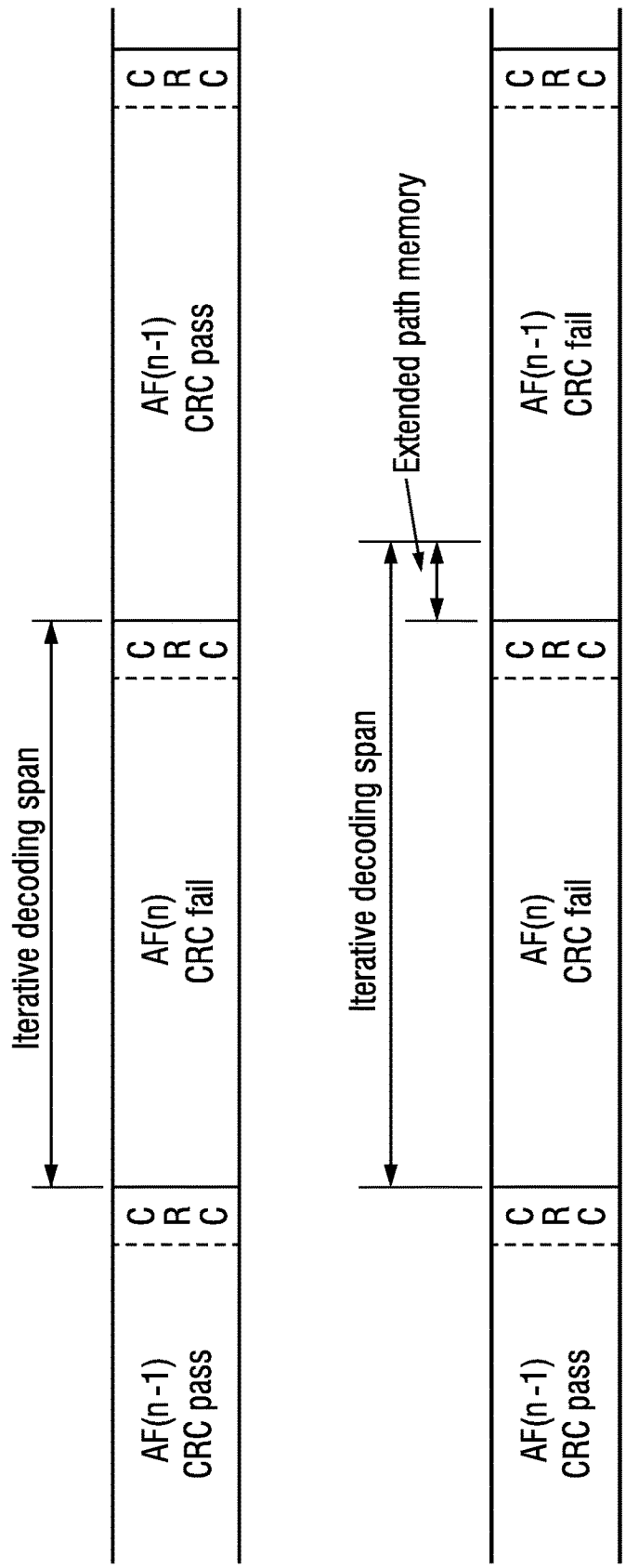
FIG. 9 is a schematic representation of a plurality of audio frames.

If all AF CRCs are correct, then this PDU decoding is complete. Otherwise the process can continue as follows. AFs with correct CRCs are used to establish the starting and/or ending states of any adjacent audio frames flagged with CRC errors. This is illustrated in FIG. 9.

A group of extended Viterbi algorithms referred to as the List Viterbi algorithms are known in the art. Whereas the Viterbi algorithm identifies the single best path through the trellis, a List Viterbi algorithm identifies the L best paths, or L best candidates, though the trellis. Versions of the List Viterbi algorithms produce a rank ordered list of the L best candidate decodings corresponding to a block of convolutional coded data. See, for example, U.S. Pat. No. 6,108,386, issued Aug. 22, 2000 to Chen et al. List Viterbi algorithms have been found to be advantageous for error detection/correction for convolutionally encoded data and, in particular, have been found to be effective in reducing error flag rates for digital audio broadcasting applications.

List decoding on the error-flagged AFs is defined in the following steps:

The List includes the next most likely bit sequences in descending order for each AF; and M-algorithm could be considered, but tailbiting needs starting probabilities for all start/end states. If the header is found to be correct on the first decoding pass (Viterbi convolutional decoding plus header RS decoding), then this would establish the correct starting and ending states for subsequent M-algorithm decoding iterations.

Perform List decoding on error-flagged AFs with known start and end states:

Limit number of list decoding attempts (e.g., L=4) for each AF to obtain a correct CRC (these are flagged as either correct(ed) or error); and Continue until all AFs having known start and end states are processed.

Perform List decoding on error-flagged AFs without known start and/or end states:
  The AF in this case should be extended into the adjacent AF(s) by the path memory before the start or end of the AF where the state is unknown;
  Limit number of list decoding attempts (e.g., L=4) to obtain a correct CRC; and
  These are flagged as either correct(ed) or error.

Balance MIPS and Memory and Performance

Although slightly better decoding performance could be obtained with long lists requiring MIPS and memory, the small additional benefit may not be worth the cost in chip resources and power. Furthermore, the MIPS, memory and power consumption would be maximum when no signal is present, which is a waste of resources. It would be desirable to limit MIPS load for unusable PDUs, (e.g., no signal).

A CRC-error threshold can be established on the first Viterbi decoding to flag PDU as failed. If most of the CRCs fail on the first decoding pass, then the PDU is likely not useful. In that case, no further decoding on that PDU is performed. The average List size per AF over each PDU can be limited to a practical number, (e.g., 2). The maximum list size (e.g., L=4) is not expected to be processed for every AF. This limit could be a variable function of correct(ed) CRCs. A worst-case bound is still useful for realtime scheduling. An M-algorithm could replace Viterbi decoder after the first iteration. Additionally the value of M could be adaptive as a function of branch metrics, path metrics, CRC errors, or other signal quality metrics.

Successive list paths would have reduced complexity. MAP, etc. can be considered for other modes where the frames are RS protected. Successive erasure or soft RS decoding can be enabled for a small additional gain.

These algorithms provided a soft output for each symbol enabling successive erasure techniques for concatenated coding. An extended mode could be considered for backward-compatible future systems where new receivers could take advantage of additional concatenated coding. These additional error control or parity bits could be placed in an extended field inside the PDU, or even in another appended PDU. Although these additional concatenated error control fields would not be recognized by existing receivers, new receivers could locate and exploit these fields for extra error protection. This would be considered backward compatible because existing receivers would continue to operate in the same way. For example, additional CRC bits or RS parity bytes could be applied to the entire (extended) PDU. This could be used to further improve the performance of the LVA or other list and/or iterative decoding techniques. Some additional improvement could be gained with iterative decoding using successive erasure techniques with the RS code. The erasure attempts in this case would include signal bits (in RS symbol bytes) with low metrics (unreliable bits). However a MAP algorithm or some variation would replace the LVA in this case.

Although larger LVA list sizes can effectively reduce audio frame error rates, they also increase the probability of false CRC detections. False CRC detections occur when there are bit errors in the associated frame, but the CRC computes a correct result, indicating no errors. False detections are particularly damaging because they pass corrupted audio frames to the codec without flagging an error, precluding the possibility of codec error concealment. This can result in the output of objectionable audible artifacts from the codec. The extended concatenated coding techniques described in the previous paragraph could be used to mitigate the problem with false CRC detections. The CRC used in the IBOC system is 8 bits, a relatively weak error detection prone to false detections. For example, a false detection would occur (statistically) in one out of every 256 audio frames where the bits are completely corrupted (e.g., no signal). This could be reduced by another factor of 256 by supplementing the CRC with another 8 bits; for example, reducing the false detection rate to 1 out of 65536, a dramatic improvement. This reduced false detection rate would enable the use of larger LVA list sizes, thereby reducing the overall audio frame error rate.

A similar improvement in the frame false detection rate could be realized by concatenated RS parity bytes (instead of, or in addition to, concatenated CRC bits). In this case the RS code would indicate an undecodable (audio, e.g.) frame if there are more errors than it could correct. Although the false detection rate associated with the RS decoding would probably be sufficient (in addition to the CRC protection) to reduce the overall (CRC and RS) false detection rate to an acceptable probability, some additional false detection reduction could be gained by not correcting all of the RS byte errors allowed by the RS code.

A header field embedded within codec frames contains information about encoded audio packets that could be exploited to improve performance. Since some of the information in the header field is not likely to change, and because certain byte values may be restricted to a limited range, it can be used as part of an iterative-decoding consistency check on incoming audio frames. If unexpected consistency values were detected, additional decoding iterations could be performed until the expected values were received.

A concatenated RS code could be used to further enhance decoding performance in a backward compatible manner. The concatenated RS parity bytes could be inserted in each Modem Frame, along with some additional information such as the size of the RS codewords and the number of parity symbols per codeword. The end of the Modem Frame is a convenient place to insert the new RS parity symbols so they can be located without any other PDU processing or location determination. New receivers would know to exploit this; however, existing receivers would decode the PDUs without knowledge of the additional RS protection. Each Modem Frame is a fixed size, and contains one or more PDUs. The RS codewords are formed uniformly across the Modem Frame. Some interleaving between the inner convolutional code and the new RS code can be applied, optionally. The regular uniform spacing of the systematic portion of the RS codewords and the Parity symbols simplify decoding, and some the addition of information about the size of the codewords and number of parity symbols per codeword enables a selectable amount of additional RS error protection versus the overhead required to provide it.

When time diversity is used, an integer number of whole RS codewords should cover each time diverse component (e.g., Block pair). This is to avoid any partial RS codewords used in the iterative decoding process. Partial RS codewords cannot be decoded in iterations. If the missing remnants of the partial RS codewords were gathered from the adjacent time diverse components, then an unwanted additional delay would be incurred, in addition to suboptimal iterative decoding due to information lost from the fragmented missing convolutional code remnants.

Iterative Decoding Algorithms

Various iterative decoding algorithms can be used with tradeoffs in performance, complexity and cost, including:

| | |
|---|---|
| LVA | List Viterbi Algorithm (L) |
| SOVA | Soft Output Viterbi Algorithm (S) |
| MAP | Maximum A Posteriori |
| MLMAP | Maxlog MAP algorithm (A, S) |
| LSMAP | List Sequence MAP algorithm |
| MLLA | Maxlog List Algorithm (A, L, S) |
| APP | A Posteriori Probability |
| M-Algorithm | M < 2k−1 states each stage |

While the CRC portion of the audio frames can be used to accept or reject the audio frame information, in one aspect, this invention exploits the CRC portion of the audio frames to provide an additional error correction function, using a List Viterbi Algorithm.

The signal processing described above can be implemented in processing circuitry in a receiver using for example a processor configured to perform the described processing.

While the present invention has been described in terms of several embodiments, it will be understood by those skilled in the art that various modifications can be made to the described embodiments without departing from the scope of the invention as set forth in the claims.

What is claimed is:

1. A radio receiver comprising:
   physical layer circuitry to receive a digital radio broadcast signal;
   processing circuitry configured to:
   receive a plurality of protocol data units of the digital radio broadcast signal, each protocol data unit having a header including a plurality of control word bits, and a plurality of audio frames or data packets, each including a cyclic redundancy check code;
   wherein the processing circuit includes an audio decoder configured to:
      decode the protocol data units using an iterative decoding technique that refines bit decoding information passed between an inner error correction code and an outer error correction code over at least one iteration of the decoding technique, wherein the iterative decoding technique comprises:
      for a first decoding iteration, decode the inner error correction code using Viterbi decoding as an inner decoding;
      pass decoding information from the inner decoding to the outer error correction code;
      use decoded cyclic redundancy check codes to detect audio frames or data packets that contain errors and flag the audio frames or data packets containing errors that require further decoding iterations; and
      change the inner decoding for the further decoding iterations of flagged audio frames or flagged data packets to include decoding the inner error correction code using at least one of soft output decoding or a List Viterbi decoding; and
   codec circuitry configured to produce an audio signal using audio frames of the protocol data units, or a data signal using data packets of the protocol data units, decoded using the iterative decoding technique.

2. The radio receiver of claim 1, wherein for the further decoding iterations, the audio decoder is configured to change the inner decoding to include a soft output decoding that includes at least one of the following: Soft Output Viterbi decoding, Maximum A Posteriori (MAP) decoding, Maxlog MAP decoding, List Sequence MAP decoding, Maxlog List decoding, an A Posteriori Probability decoding, or an M-Algorithm decoding with M states for each decoding stage k, wherein M and k are integers and M<2k−1.

3. The radio receiver of claim 2, wherein the audio decoder is configured to use soft outputs of the inner error correction decoding to identify possible erasure symbols for erasure decoding of an outer Reed-Solomon code.

4. The radio receiver of claim 1, wherein the decoding information comprises a Reed-Solomon code included in the audio frames or data. packets.

5. The radio receiver of claim 1, wherein the audio decoder is configured to change the inner decoding to include List Viterbi decoding, and wherein the information passed between an inner error correction code and an outer error correction code limits the number of decoding attempts by the List Viterbi decoding.

6. The radio receiver of claim 1, wherein the audio decoder is configured to change the inner decoding for the further decoding iterations to use a soft output decoding that comprises an M-algorithm, and wherein a value of M in the M-algorithm is adapted as a function of branch metrics, path metrics, cyclic redundancy check errors, or other signal quality metrics.

7. The radio receiver of claim 1, wherein the audio decoder is configured to use a cyclic redundancy check error threshold on the first Viterbi decoding to flag a protocol data unit as failed, and stop the decoding if more than a predetermined number of cyclic redundancy checks fail on a first decoding pass.

8. The radio receiver of claim 1, wherein the audio decoder is configured to perform the inner error correction code of the iterative decoding technique using a tailbiting decoder having an overlap spanning at least a path memory past the header.

9. The radio receiver of claim 1, wherein the audio decoder is configured to vary a limit on maximum list size of the iterations of the iterative decoding technique as a function of a number of correct or corrected cyclic redundancy checks.

10. The radio receiver of claim 1, wherein the audio decoder is configured to convolutionally encode the protocol data unit with protocol control information control word bits present, and the protocol control information control word bits are removed from the protocol data unit after convolution decoding but before cyclic redundancy check processing of each audio frame or data packet.

11. The radio receiver of claim 10, wherein the audio decoder is configured to remove the protocol control information control word bits in iterative decoding steps before cyclic redundancy check processing and restored prior to subsequent convolutional decoding in each iteration.

12. The radio receiver of claim 1,
   wherein the audio decoder is configured to perform list decoding on error-flagged audio frames or data packets with known start or known end states.

13. The radio receiver of claim 1,
   wherein the audio decoder is configured to continue iterative decoding until all audio frames or data packets having known start and end states are processed.

14. The radio receiver of claim 13,
   wherein the audio decoder is configured to perform list decoding on error-flagged audio frames or data packets without known start states or known end states.

15. The radio receiver of claim 14, wherein the audio decoder is configured to extend decoding of audio frames or data packets without known start states or known end states into adjacent audio frames or data packets by a path memory before the start or end of an audio frame where the state is unknown.

16. The radio receiver of claim 12, wherein the audio decoder is configured to use audio frames with correct cyclic redundancy checks to establish either starting states or ending states, or starting states and ending states, of any adjacent audio frames or data packets flagged with cyclic redundancy check errors.

17. The radio receiver of claim 1,
wherein the audio decoder is configured to:
use the header as part of an iterative-decoding consistency check on incoming audio frames or data packets; and
if unexpected consistency values were detected in the header, perform additional decoding iterations until the expected values were received or a predetermined number of decoding attempts were made.

18. The radio receiver of claim 2, wherein the audio decoder is configured to enhance decoding performance in a backward compatible manner using a concatenated Reed-Solomon outer code.

19. The radio receiver of claim 18, wherein the audio decoder is configured to insert the concatenated Reed-Solomon parity bytes in the protocol data units in a modem frame, along with the size of the Reed Solomon codewords and the number of parity symbols per codeword.

20. The radio receiver of claim 18, wherein the audio decoder is configured to apply interleaving between an inner convolutional code and the Reed-Solomon code is applied when time diversity is used, an integer number of whole Reed-Solomon codewords cover each time diverse component.

21. The radio receiver of claim 3 including a first polynomial generator to flag the audio frames or data packets containing errors that require further decoding iterations, and a different polynomial generator to compute a second cyclic redundancy check for a second cyclic redundancy check byte in each audio frame or data packet to improve the error detection probability.

* * * * *

UNITED STATES PATENT AND TRADEMARK OFFICE
CERTIFICATE OF CORRECTION

PATENT NO. : 10,248,496 B2  
APPLICATION NO. : 14/266907  
DATED : April 2, 2019  
INVENTOR(S) : Kroeger et al.

Page 1 of 1

It is certified that error appears in the above-identified patent and that said Letters Patent is hereby corrected as shown below:

In the Claims

In Column 14, Line 9, in Claim 4, delete "data." and insert --data-- therefor

In Column 14, Line 53, in Claim 12, after "claim 1,", delete "¶"

In Column 14, Line 57, in Claim 13, after "claim 1,", delete "¶"

In Column 14, Line 61, in Claim 14, after "claim 13,", delete "¶"

In Column 15, Line 17, in Claim 18, delete "claim 2," and insert --claim 1,-- therefor In Column 16, Line 13, in Claim 21, delete "claim 3" and insert --claim 1-- therefor Signed and Sealed this  
Twenty-first Day of April, 2020

Andrei Iancu  
*Director of the United States Patent and Trademark Office*